(12) United States Patent
Lee et al.

(10) Patent No.: US 9,093,651 B2
(45) Date of Patent: Jul. 28, 2015

(54) COMPOSITION, ORGANIC LIGHT-EMITTING DISPLAY APPARATUS INCLUDING THE COMPOSITION, AND METHOD OF MANUFACTURING THE ORGANIC LIGHT-EMITTING DISPLAY APPARATUS

(71) Applicant: Samsung Display Co., Ltd., Yongin, Gyeonggi-Do (KR)

(72) Inventors: Byoung-Duk Lee, Yongin (KR); Yong-Tack Kim, Yongin (KR); Jong-Woo Kim, Yongin (KR); Min-Ho Oh, Yongin (KR); So-Young Lee, Yongin (KR); Jin-Hwan Jeon, Yongin (KR); Yun-Ah Chung, Yongin (KR); Yoon-Hyeung Cho, Yongin (KR); Yong-Chan Ju, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/330,992

(22) Filed: Jul. 14, 2014

(65) Prior Publication Data

US 2015/0060797 A1  Mar. 5, 2015

(30) Foreign Application Priority Data

Sep. 2, 2013  (KR) .................. 10 2013 0105085

(51) Int. Cl.
*H01L 21/56*  (2006.01)
*H01L 51/00*  (2006.01)
*H01L 27/32*  (2006.01)
(Continued)

(52) U.S. Cl.
CPC ........ *H01L 51/0058* (2013.01); *H01L 27/3241* (2013.01); *H01L 51/006* (2013.01); *H01L 51/5253* (2013.01); *H01L 51/56* (2013.01)

(58) Field of Classification Search
CPC ......... C08L 53/00; C08L 35/02; C08L 65/00; C08L 93/04; C08L 2203/206; C08L 2205/025; C08L 63/00; H01L 51/448; H01L 2251/5338; H01L 51/107; H01L 31/0481; H01L 2924/12044; H01L 21/02126; H01L 21/02216; H01L 21/56; H01L 23/3192; H01L 51/0036; H01L 51/0043; H01L 2227/326; H01L 2251/56; H01L 23/29; H01L 51/0037; C09J 2433/00; C09J 2453/00; C08F 2220/1825; C08F 220/14; C08F 2220/1891; B05D 5/12; Y10S 428/917; Y02B 20/181
See application file for complete search history.

(56) References Cited

U.S. PATENT DOCUMENTS

| | | | |
|---|---|---|---|
| 6,268,695 B1 | 7/2001 | Affinito | |
| 6,413,645 B1 | 7/2002 | Graff et al. | |
| 7,902,374 B2 * | 3/2011 | Lin et al. ....................... | 548/103 |

(Continued)

FOREIGN PATENT DOCUMENTS

| | | |
|---|---|---|
| KR | 10-2005-0051699 A | 6/2005 |
| KR | 10-2012-0024658 A | 3/2012 |

(Continued)

*Primary Examiner* — Even Pert
*Assistant Examiner* — Gustavo Ramallo
(74) *Attorney, Agent, or Firm* — Knobbe Martens Olson & Bear LLP

(57) ABSTRACT

In an aspect, a composition including an acrylate monomer, and aromatic aryl amine compound, an organic light emitting display apparatus including the composition and a method of manufacturing an organic light emitting display apparatus including the composition are provided.

20 Claims, 3 Drawing Sheets

(51) Int. Cl.
*H01L 51/56* (2006.01)
*H01L 51/52* (2006.01)

(56) References Cited

U.S. PATENT DOCUMENTS

| | | | | |
|---|---|---|---|---|
| 8,283,057 | B2 * | 10/2012 | Kim et al. | 428/690 |
| 8,298,684 | B2 * | 10/2012 | Kwang et al. | 428/690 |
| 8,334,060 | B2 * | 12/2012 | Hwang et al. | 428/690 |
| 8,865,321 | B2 * | 10/2014 | Stoessel et al. | 428/690 |
| 2004/0026663 | A1 * | 2/2004 | Heuer et al. | 252/301.16 |
| 2005/0244671 | A1 * | 11/2005 | Rajeswaran et al. | 428/690 |
| 2006/0012296 | A1 | 1/2006 | Eida et al. | |
| 2008/0157065 | A1 * | 7/2008 | Krishnamoorthy et al. | 257/40 |
| 2009/0184292 | A1 * | 7/2009 | Ohuchi et al. | 252/301.35 |
| 2011/0171447 | A1 * | 7/2011 | Krishnamoorthy et al. | 428/220 |
| 2011/0215716 | A1 * | 9/2011 | Belgorodsky et al. | 313/512 |
| 2012/0080671 | A1 * | 4/2012 | Niboshi et al. | 257/40 |
| 2012/0083056 | A1 * | 4/2012 | Shinbori et al. | 438/27 |
| 2012/0256534 | A1 * | 10/2012 | Lee et al. | 313/504 |

FOREIGN PATENT DOCUMENTS

| | | |
|---|---|---|
| KR | 10-2012-0034013 A | 4/2012 |
| KR | 10-2012-0115842 A | 10/2012 |

* cited by examiner

COMPOSITION, ORGANIC LIGHT-EMITTING DISPLAY APPARATUS INCLUDING THE COMPOSITION, AND METHOD OF MANUFACTURING THE ORGANIC LIGHT-EMITTING DISPLAY APPARATUS

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0105085 filed in the Korean Intellectual Property Office on Sep. 2, 2013, the disclosure of which is incorporated herein by reference in its entirety.

BACKGROUND

1. Field

This disclosure relates to a composition, an organic light emitting display apparatus including the composition, and a method of manufacturing the organic light emitting display apparatus.

2. Description of the Related Technology

An organic light emitting device (OLED) is a self-emission type device having high brightness, low driving voltage, and high response speed and capable of realizing multiple colors, as well as a wide viewing angle and high contrast, and thus, an organic light emitting display apparatus using an OLED is considered as a next generation display apparatus.

An OLED includes a pixel electrode and an opposite electrode facing each other, and an emission layer including an organic material disposed between the pixel electrode and the opposite electrode. The emission layer including the organic material may be deteriorated by moisture or oxygen, and thus, an encapsulation technology may be used to prevent external moisture and oxygen from penetrating through the OLED.

SUMMARY

One or more embodiments include an organic light emitting device (OLED) capable of reducing occurrence of dark spots.

Additional aspects will be set forth in part in the description which follows and, in part, will be apparent from the description, or may be learned by practice of the presented embodiments.

Some embodiments provide a composition including a compound of Formula 1, a compound of Formula 2, and a compound of Formula 3:

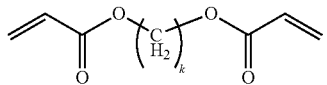

Formula 1

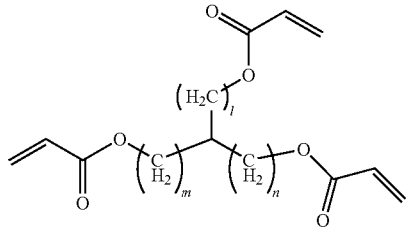

Formula 2

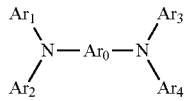

Formula 3 where k, l, m, and n respectively denote a number of 1 to 1,000,000, $Ar_0$ denotes a substituted or unsubstituted naphthylene group, a substituted or unsubstituted anthracenylene group, a substituted or unsubstituted phenanthrenyl group, a substituted or unsubstituted chrysenylene group, a substituted or unsubstituted pyrenylene group, a substituted or unsubstituted benzoanthracenylene group, a substituted or unsubstituted fluoran thenylene group, benzo fluoran thenylene group, a substituted or unsubstituted perylenylene group, a substituted or unsubstituted coronenylene group, a substituted or unsubstituted pycenylene group, a substituted or unsubstituted diphenyl anthracenyelen group, a substituted or unsubstituted triphenylene group, a substituted or unsubstituted rubicenylene group, a substituted or unsubstituted phenyl anthracenylene group, a substituted or unsubstituted bis anthracenylene group, a substituted or unsubstituted dianthracenyl benzynylene group, or a substituted or unsubstituted dibenzo anthracenylene group, and $Ar_1$ through $Ar_4$ respectively denote a C6 through C50 substituted or unsubstituted aryl group, a C1 through C50 substituted or unsubstituted alkyl group, a C3 through C50 substituted or unsubstituted cyclo alkyl group, a C7 through C50 substituted or unsubstituted aralkyl group, or a substituted or unsubstituted heteroaryl group having 5 to 50 ring atoms.

In some embodiments, the aromatic aryl amine compound represented by Formula 3 may be a fluorescent light emission material.

In some embodiments, k, l, m, and n may independently denote a number of 1 to 10,000, respectively.

In some embodiments, $Ar_0$ may be an anthraceylene group, a pyrenylene group, or a chrysenylene group, and $Ar_1$ through $Ar_4$ respectively denote a C6 through C50 substituted or unsubstituted aryl group or a substituted or unsubstituted heteroaryl group having 5 to 50 ring atoms.

In some embodiments, a sum of a weight of the compound of Formula 1 and a weight of the compound of Formula 2 may be about 95 to about 99.9 weight % of a total weight of the composition, and the weight of the compound of Formula 3 may be about 0.1 to about 5 weight % of the total weight of the composition.

Some embodiments provide an organic light emitting display apparatus includes: a substrate; a display unit including a plurality of organic light emitting devices (OLEDs) arranged on the substrate; and an encapsulation layer for sealing the display unit, wherein the encapsulation layer may include at least one organic layer and at least one inorganic layer stacked with each other, and the organic layer may include the above composition.

In some embodiments, the aromatic aryl amine compound represented by Formula 3 may be a fluorescent light emission material.

In some embodiments, k, l, m, and n may independently denote a number of 1 to 10,000, respectively.

In some embodiments, $Ar_0$ may be an anthraceylene group, a pyrenylene group, or a chrysenylene group, and $Ar_1$ through $Ar_4$ may respectively denote a C6 through C50 substituted or unsubstituted aryl group or a substituted or unsubstituted heteroaryl group having 5 to 50 ring atoms.

In some embodiments, a sum of a weight of the compound of Formula 1 and a weight of the compound of Formula 2 may be about 95 to about 99.9 weight % of a total weight of the composition, and the weight of the compound of Formula 3 may be about 0.1 to about 5 weight % of the total weight of the composition.

In some embodiments, the at least one inorganic layer may be greater than the at least one organic layer so as to cover end portions of the at least one organic layer.

In some embodiments, the OLED may include a pixel electrode, an intermediate layer disposed on the pixel electrode and including an organic emission layer, and an opposite electrode disposed on the intermediate layer, and a capping layer covering the opposite electrode may be further formed between the opposite electrode and the encapsulation layer.

In some embodiments, the capping layer may include an organic material.

In some embodiments, the organic light emitting display apparatus may further include a shielding layer including lithium fluoride (LiF) between the capping layer and the encapsulation layer.

In some embodiments, one of the at least one inorganic layer may be a porous inorganic layer.

In some embodiments, the porous inorganic layer may include aluminum oxide.

Some embodiments provide a method of manufacturing an organic light emitting display apparatus includes: forming a plurality of organic light emitting devices (OLEDs) on a substrate; and forming an encapsulation layer covering the OLEDs, wherein the encapsulation layer may be formed to include at least one organic layer including the above composition, and at least one inorganic layer, and the at least one organic layer may be formed by using an inkjet printing method.

In some embodiments, one of the at least one inorganic layer may be formed by using a sputtering method.

In some embodiments, one of the at least one inorganic layer may be formed by using a chemical vapor deposition method.

In some embodiments, one at least one of inorganic layer may be greater than the at least one organic layer so as to cover end portions of the organic layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
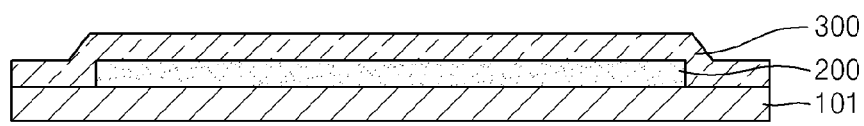
FIG. 1 is a schematic cross-sectional view of an organic light emitting display apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

Hereinafter, the present disclosure will be described more fully with reference to the accompanying drawings, in which exemplary embodiments of the invention are shown. This disclosure may, however, be embodied in many different forms and should not be construed as limited to the exemplary embodiments set forth herein. Rather, these embodiments are provided so that this disclosure will be thorough and complete, and will fully convey the scope of the embodiments to those skilled in the art. In the drawings, lengths and sizes of layers and regions may be exaggerated for clarity.

Figure 2:
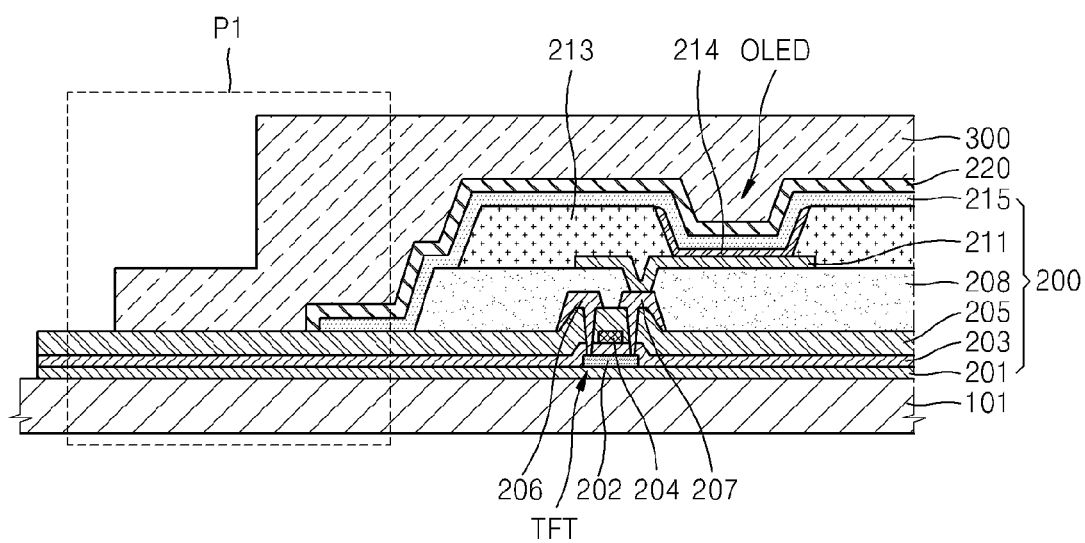
FIG. 2 is a cross-sectional view showing a part of the organic light emitting display apparatus of FIG. 1 in more detail.
Figure 3:
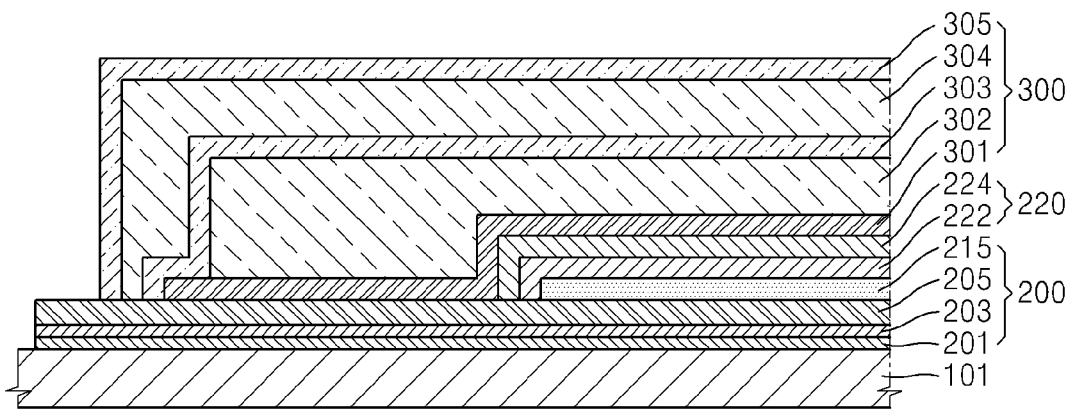
FIG. 3 is an expanded view of a portion P1 in FIG. 2.

FIG. 1 is a schematic cross-sectional view of an organic light emitting display apparatus 10 according to an embodiment of the present invention, FIG. 2 is a cross-sectional view showing a part of the organic light emitting display apparatus 10 of FIG. 1 in more detail, and FIG. 3 is an expanded view of a part P1 shown in FIG. 2.

Referring to embodiments shown in FIGS. 1 through 3, the organic light emitting display apparatus 10 may include a substrate 101, a display unit 200, and an encapsulation layer 300.

In some embodiments, the substrate 101 may be a flexible substrate formed of a plastic material having a high thermal resistance or a high durability such as polyimide, polyethylene terephthalate (PET), polycarbonate, polyethylene naphtalate, polyarylate (PAR), and polyetherimide. However, the embodiments are not limited thereto, that is, the substrate 101 may be formed of various materials such as a metal material or a glass material.

In some embodiments, the display unit 200 may include a plurality of organic light emitting devices (OLEDs) arranged on the substrate 101. The OLEDs are electrically connected to thin film transistors (TFTs) formed on the substrate 101.

In some embodiments, a buffer layer 201 may be formed on the substrate 101. In some embodiments, the buffer layer 201 prevents impurity ions from infiltrating into the substrate 101, and provides a flat surface on an upper portion of the substrate 101. In some embodiments, the buffer layer 201 may include, for example, an inorganic material such as silicon oxide, silicon nitride, silicon oxynitride, aluminum oxide, aluminum nitride, titanium oxide, or titanium nitride, or an organic material such as polyimide, polyester, or acryl, and may be formed as a stacked layer including a plurality of above described materials.

In some embodiments, the TFT may be formed on the buffer layer 201. In some embodiments, the TFT may include an active layer 202, a gate electrode 204, a source electrode 206, and a drain electrode 207.

In some embodiments, the active layer 202 may be formed of inorganic semiconductor such as amorphous silicon or polysilicon. In some embodiments, the active layer 202 may be generally formed of an organic semiconductor or oxide semiconductor, in addition to the inorganic semiconductor.

In some embodiments, a gate insulating layer 203 may be formed on the active layer 202. In some embodiments, the gate insulating layer 203 may be formed of an organic material, or an inorganic material such as SiNx or $SiO_2$.

In some embodiments, A gate electrode 204 is formed on the gate insulating layer 203. In some embodiments, the gate electrode 204 may include Au, Ag, Cu, Ni, Pt, Pd, Al, or Mo, and an alloy such as Al:Nd alloy or Mo:W alloy. However, the gate electrode 204 may be formed of various materials in consideration of design conditions.

In some embodiments, an interlayer insulation layer 205 may be formed on the gate electrode 204. In some embodiments, the interlayer insulation layer 205 may be disposed between the gate electrode 204 and the source electrode 206, and between the gate electrode 204 and the drain electrode 207 so as to insulate the electrodes from each other, and may be formed as a single-layered or a multi-layered structure by using an inorganic material such as SiNx or $SiO_2$.

In some embodiments, the source electrode 206 and the drain electrode 207 are formed on the interlayer insulation layer 205. FIG. 2 shows a top gate type TFT, in which the active layer 202, the gate electrode 204, and the source and drain electrodes 206 and 207 are sequentially stacked on the substrate 101, as an example; however, the embodiments of the present disclosure are not limited thereto. The TFT may have various structures, for example, a bottom gate type, in which the gate electrode 204 is disposed under the active layer 202.

In some embodiments, the TFT may be electrically connected to the OLED to drive the OLED, and may be covered by a passivation layer 208 to be protected.

In some embodiments, the passivation layer 208 may be formed of an inorganic insulation layer and/or an organic insulation layer. The inorganic insulation layer may include $SiO_2$, SiNx, SiON, $Al_2O_3$, $TiO_2$, $Ta_2O_5$, $HfO_2$, $ZrO_2$, BST, or PZT, and the organic insulation layer may include universal polymers (poly(methyl methacrylate) (PMMA) or polystyrene (PS)), polymer derivative having phenol group, acryl-based polymer, imide-based polymer, aryleter-based polymer, amide-based polymer, fluoride-based polymer, p-xylene-based polymer, vinyl alcohol-based polymer, and blends thereof. In some embodiments, the passivation layer 208 may be formed as a composite stacked layer of the inorganic insulation layer and the organic insulation layer.

In some embodiments, the OLED may include a pixel electrode 211, an intermediate layer 214, and an opposite electrode 215.

In some embodiments, at least one of the pixel electrode 211 and the opposite electrode 215 may be formed as a transparent/semi-transparent electrode, and the other may be formed as a reflective electrode. For example, if the pixel electrode 211 is a reflective electrode, the pixel electrode 211 may include a reflective layer formed of Ag, Mg, Al, Pt, Pd, Au, Ni, Nd, Ir, Cr, or a compound thereof, and a transparent or semi-transparent electrode layer formed on the reflective layer and including a transparent conductive oxide material. If the opposite electrode 215 is a transparent or semi-transparent electrode, the opposite electrode 215 may be formed as a metal thin film of a small work function including Li, Ca, LiF/Ca, LiF/Al, Al, Ag, Mg, or a compound thereof to a thickness of about 5 to about 20 nm. Therefore, the opposite electrode 215 may transmit light emitted from an organic emission layer.

In some embodiments, a pixel defining layer 213 is formed to open a predetermined region of the pixel electrode 211 and cover end portions of the pixel electrode 211.

In some embodiments, the intermediate layer 214 including the organic emission layer is located between the pixel electrode 211 and the opposite electrode 215.

In some embodiments, the organic emission layer may be formed of a lower molecular organic material or a high molecular organic material, and may selectively include a hole transport layer (HTL), a hole injection layer (HIL), an electron transport layer (HTL), and an electron injection layer (EIL), in addition to the organic emission layer.

In some embodiments, the HIL may be formed on the pixel electrode by using various methods, for example, a vacuum deposition method, a spin coating method, a cast method, and an LB method, etc.

When the HIL is formed by using the vacuum deposition method, deposition conditions may vary depending on a compound used as a material for forming the HIL, a structure of a target HIL, and a thermal characteristic; however, may be selected from a deposition temperature within a range of, for example, about 100 to about 500° C., a vacuum degree of about $10^{-8}$ to about $10^{-3}$ torr, and a deposition speed of about 0.01 to about 100 Å/sec. However, the embodiments of the present disclosure are not limited thereto.

When the HIL is formed by using the spin coating method, coating conditions may vary depending on a compound used as a material for forming the HIL, a structure of a target HIL, and a thermal characteristic; however, a coating speed may be selected within a range from about 2000 rpm to about 5000 rpm, and a thermal treatment process for removing solvent after the coating process may be selected within a range of about 80° C. to about 200° C. However, the embodiments of the present invention are not limited thereto.

Examples of the hole injection layer-forming material are, for example, N,N'-diphenyl-N,N'-bis-[4-(phenyl-m-tolyl-amino)-phenyl]-biphenyl-4,4'-diamine (DNTPD), a phthalocyanine compound such as copper phthalocyanine, [4,4',4"-tris(3-methylphenylphenylamino)triphenylamine] (m-MTDATA), (N,N'-di(1-naphthyl)-N,N'-diphenylbenzidine) (NPB), TDATA, 2-TNATA, Pani/DBSA (Polyaniline/Dodecylbenzenesulfonic acid), Poly(3,4-ethylenedioxythiophene)/Poly(4-styrenesulfonate) (PEDOT/PSS), Polyaniline/Camphor sulfonic acid (Pani/CSA), and Polyaniline/Poly(4-styrenesulfonate) (PANI/PSS), but are not limited thereto:

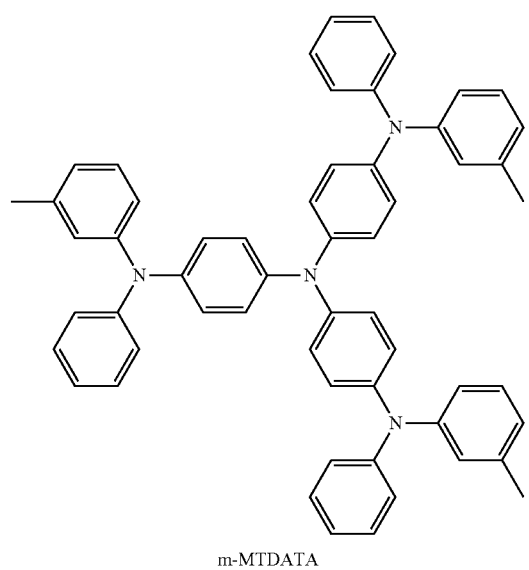

m-MTDATA

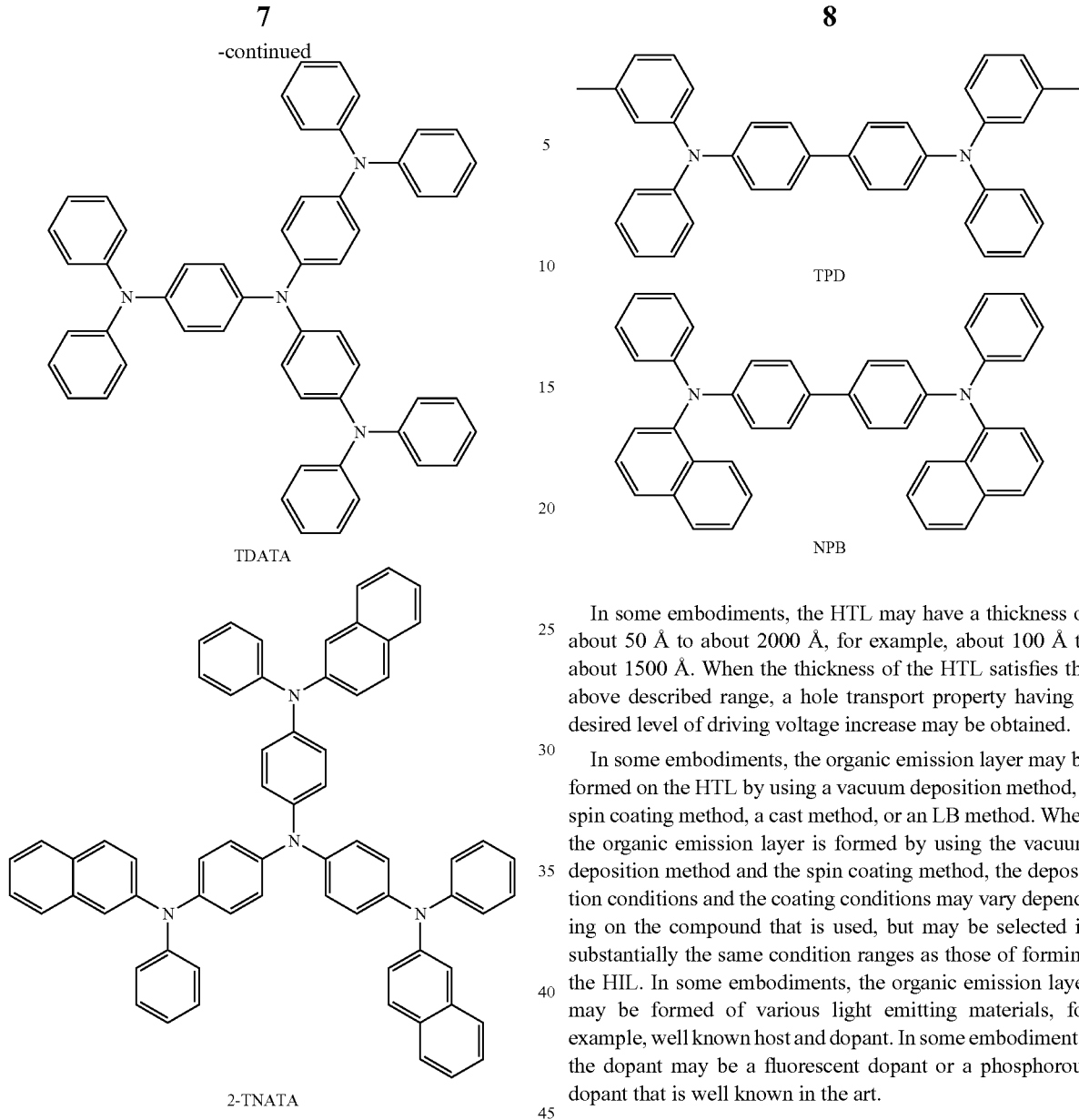

TDATA

2-TNATA

TPD

NPB

In some embodiments, the HIL may have a thickness of about 100 Å to about 10000 Å, in particular, about 100 Å to about 1000 Å. If the thickness of the HIL satisfies the above described range, a desired hole injection property may be obtained without raising a driving voltage substantially.

In some embodiments, the HTL may be formed on the HIL by using various methods such as a vacuum deposition method, a spin coating method, a cast method, or an LB method. When the HTL is formed by using the vacuum deposition method and the spin coating method, the deposition conditions and the coating conditions may vary depending on the compound that is used, but may be selected in substantially the same condition ranges as those of forming the HIL.

In some embodiments, the hole transport layer-forming material may be, for example, carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4''-tris(N-carbazolyl)triphenylamine) (TCTA), and N,N'-di(1-naphthyl)-N,N'-diphenylbenzidine) (NPB), but is not limited thereto:

In some embodiments, the HTL may have a thickness of about 50 Å to about 2000 Å, for example, about 100 Å to about 1500 Å. When the thickness of the HTL satisfies the above described range, a hole transport property having a desired level of driving voltage increase may be obtained.

In some embodiments, the organic emission layer may be formed on the HTL by using a vacuum deposition method, a spin coating method, a cast method, or an LB method. When the organic emission layer is formed by using the vacuum deposition method and the spin coating method, the deposition conditions and the coating conditions may vary depending on the compound that is used, but may be selected in substantially the same condition ranges as those of forming the HIL. In some embodiments, the organic emission layer may be formed of various light emitting materials, for example, well known host and dopant. In some embodiments, the dopant may be a fluorescent dopant or a phosphorous dopant that is well known in the art.

If the OLED is a full-color OLED, the organic emission layer may be patterned as a red emission layer, a green emission layer, and a blue emission layer.

In some embodiments, the ETL may be formed on the organic emission layer by using various methods such as a vacuum deposition method, a spin coating method, and a cast method. If the ETL is formed by using the vacuum deposition method or the spin coating method, the deposition conditions and the coating conditions may vary depending on the compound that is used, but may be selected in substantially the same condition ranges as those of forming the HIL.

An electron transport layer-forming material safely transports electrons injected from an electron injection electrode (cathode), and may be a well known electron transport material. Examples of the electron transport material may include quinoline derivatives, in particular, tris(8-quinolinolato)aluminum) ($Alq_3$), TAZ, Balq, beryllium bis(benzoquinolin-10-olate ($Bebq_2$), ADN, compound 201, and compound 202, but are not limited thereto:

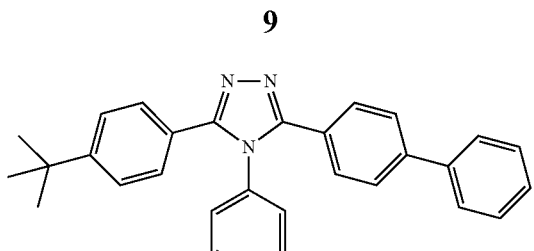

TAZ

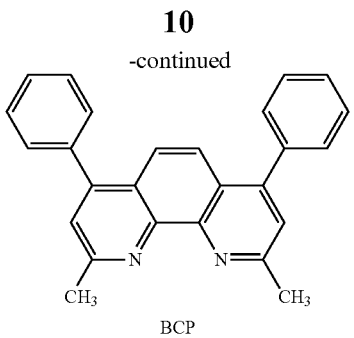

BCP

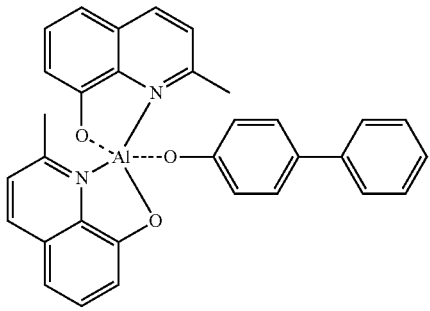

BAlq

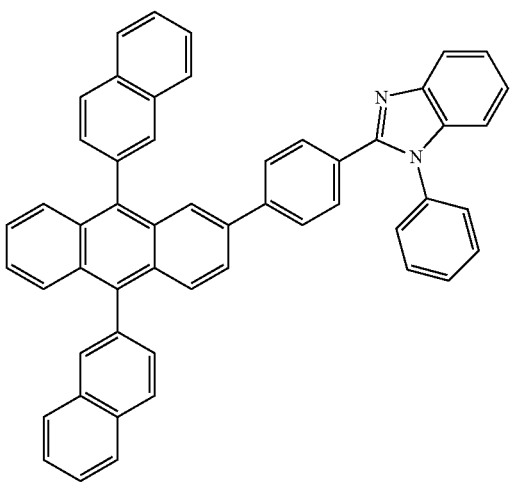

compound 201

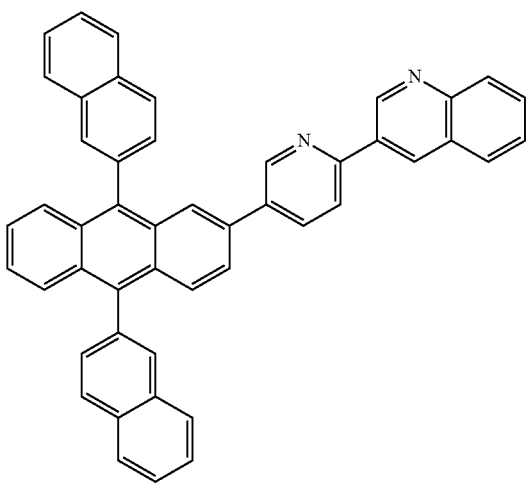

compound 202

In some embodiments, the ETL may have a thickness of about 100 Å to about 1000 Å, for example, about 150 Å to about 500 Å. When the thickness of the ETL satisfies the above described range, an electron transport property having a desired level of driving voltage increase may be obtained.

In some embodiments, the EIL allowing the electrons to be easily injected from a cathode may be formed on the ETL, and well known electron injection materials may be used.

Materials for forming the EIL may include LiF, NaCl, CsF, $Li_2O$, and BaO. In some embodiments, the deposition conditions of the EIL may vary depending on the compound that is used, but may be selected in substantially the same condition ranges as those of forming the HIL.

In some embodiments, the EIL may have a thickness of about 1 Å to about 100 Å, for example, about 3 Å to about 90 Å. When the thickness of the EIL satisfies the above described range, an electron transport property having a desired level of driving voltage increase may be obtained.

In some embodiments, a protective layer 220 may be formed on the opposite electrode 215 of the OLED. In some embodiments, the protective layer 220 may include a capping layer 222 covering the opposite electrode 215 and a shielding layer 224 formed on the capping layer 222 as shown in FIG. 3.

In some embodiments, the capping layer 222 may be formed to completely cover the opposite electrode 215. In some embodiments, the capping layer 222 may be formed of an organic material such as a-NPD, NPB, TPD, m-MTDATA, $Alq_3$, or CuPc. In some embodiments, the capping layer 222 protects the OLED against external physical shock, and at the same time, makes the light emitted from the OLED effectively discharged to outside. In some embodiments, the capping layer 222 may have a thickness of about 20 nm to about 200 nm.

In some embodiments, the shielding layer 224 may be formed of an inorganic material LiF, $MgF_2$, or $CaF_2$. In some embodiments, the shielding layer 224 may be formed to cover the capping layer 222. In some embodiments, the shielding layer 224 blocks plasma that is used in a process of forming a first inorganic layer 301 that will be described later so that the plasma does not infiltrate into the OLED and does not damage the intermediate layer 214 and the opposite electrode 215. In some embodiments, the shielding layer 224 may have a thickness of about 30 nm to about 200 nm. In some embodiments, the shielding layer 224 may be formed of lithium fluoride (LiF) having a porous pin-hole structure.

In some embodiments, a dipole moment of the shielding layer 224 may have a large value. When the shielding layer 224 and the opposite electrode 215 contact each other, an oxidation reaction may occur on the surface of the opposite electrode 215 due to the shielding layer 224 having a large dipole moment. Since the opposite electrode 215 is oxidated, pixel shrinkage may occur in the OLED.

However, according to the embodiment of the present disclosure, since the capping layer 222 completely covers the opposite electrode 215, the shielding layer 224 and the opposite electrode 215 do not contact each other. Therefore, a surface reaction between the shielding layer 224 and the opposite electrode 215 is prevented, and thus, the oxidation of the opposite electrode 215 caused by the shielding layer 224 may be fundamentally prevented. Accordingly, the pixel shrinkage caused by the oxidation of the opposite electrode 215 may be prevented.

In some embodiments, an encapsulation layer 300 is disposed on the shielding layer 224. In order to realize a flexible and light display apparatus, a thin film encapsulation for protecting the OLED against external moisture and oxygen is necessary. The thin film encapsulation method has to satisfy a water vapor transmission rate (WVTR), that is, $10^{-6}$ g/m²/day, of the OLED, and thus, is formed by repeatedly depositing an inorganic layer and an organic layer.

In some embodiments, the encapsulating layer 300 may include at least one layer of an organic layer and at least one layer of inorganic layer. In FIG. 3, the encapsulation layer 300 includes a first inorganic layer 301, a first organic layer 302, a second inorganic layer 303, a second organic layer 304, and a third inorganic layer 305; however, the embodiments of the present disclosure are not limited thereto.

In some embodiments, the first inorganic layer 301 may be formed of, for example, aluminum oxide. In some embodiments, the first inorganic layer 301 may be a porous inorganic layer. In some embodiments, the porous first inorganic layer may be formed by a sputtering method to a predetermined thickness, and the porous first inorganic layer 301 deposited on the porous shielding layer 224 grows along a crystalline structure of the porous shielding layer 224. That is, the porous inorganic layer formed on the porous lithium fluoride (LiF) having a pin-hole structure has fine cracks entirely.

In some embodiments, the first organic layer 302 formed on the first inorganic layer 301 may be formed of an organic polymer. In some embodiments, the first organic layer 302 is formed on the first inorganic layer 301, and may be formed to a predetermined thickness so as to planarize a stepped portion caused by the pixel defining layer 213.

In some embodiments, the first organic layer 302 may be formed of a composition including at least one type of acrylate monomer, and aromatic aryl amine compound. In some embodiments, the first organic layer 302 may be formed of a composition including at least two different types of acrylate monomer, and aromatic aryl amine compound. In some embodiments, the first organic layer 302 may be formed of a composition including a compound of Formula 1, a compound of by Formula 2, and a compound of Formula 3:

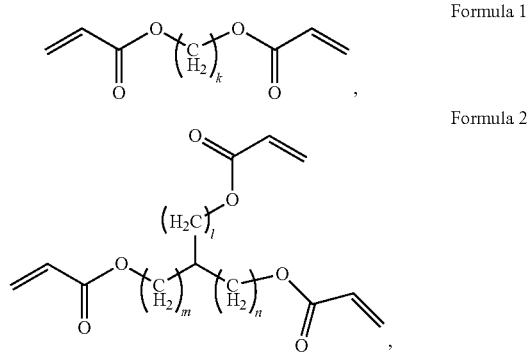

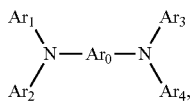

wherein, in the above Formulae 1-3, k, l, m, and n respectively denote a number from 1 to 1,000,000. The composition including the compounds of Formulae 1, 2, and 3 may be polymerized by being cured in a well-known method. For example, the composition may be cured by UV radiation.

In addition, $Ar_0$ denotes a substituted or unsubstituted naphthylene group, a substituted or unsubstituted anthracenylene group, a substituted or unsubstituted phenanthrenyl group, a substituted or unsubstituted chrysenylene group, a substituted or unsubstituted pyrenylene group, a substituted or unsubstituted benzoanthracenylene group, a substituted or unsubstituted fluoranthenylene group, benzofluoranthenylene group, a substituted or unsubstituted perylenylene group, a substituted or unsubstituted coronenylene group, a substituted or unsubstituted pycenylene group, a substituted or unsubstituted diphenylanthracenylene group, a substituted or unsubstituted triphenylene group, a substituted or unsubstituted rubicenylene group, a substituted or unsubstituted phenylanthracenylene group, a substituted or unsubstituted bisanthracenylene group, a substituted or unsubstituted dianthracenylbenzynylene group, or a substituted or unsubstituted dibenzoanthracenylene group.

In some embodiments, $Ar_1$ through $Ar_4$ respectively denote a C6 through C50 substituted or unsubstituted aryl group, a C1 through C50 substituted or unsubstituted alkyl group, a C3 through C50 substituted or unsubstituted cyclo alkyl group, a C7 through C50 substituted or unsubstituted aralkyl group, or a substituted or unsubstituted heteroaryl group having 5 to 50 ring atoms.

In some embodiments, the aromatic aryl amine compound in the chemical formula 3 may be a fluorescent emission material.

In some embodiments, k, l, m, and n may be respectively the number of 1 through 10,000.

In some embodiments, $Ar_0$ is an anthraceylene group, a pyrenylene group, or a chrysenylene group, and $Ar_1$ through $Ar_4$ respectively denote a C6 through C50 substituted or unsubstituted aryl group or a substituted or unsubstituted heteroaryl group having 5 to 50 ring atoms.

In some embodiments, a sum of a weight of the compound of Formula 1 and a weight of the compound of Formula 2 is about 95 to about 99.9 weight % of a total weight of the composition, and the weight of the compound of Formula 3 may be about 0.1 to about 5 weight % of the total weight of the composition.

If the first organic layer 302 is formed by using an evaporation method, the first organic layer 302 may be spread out of a region that is originally intended to form a film.

Figure 4:
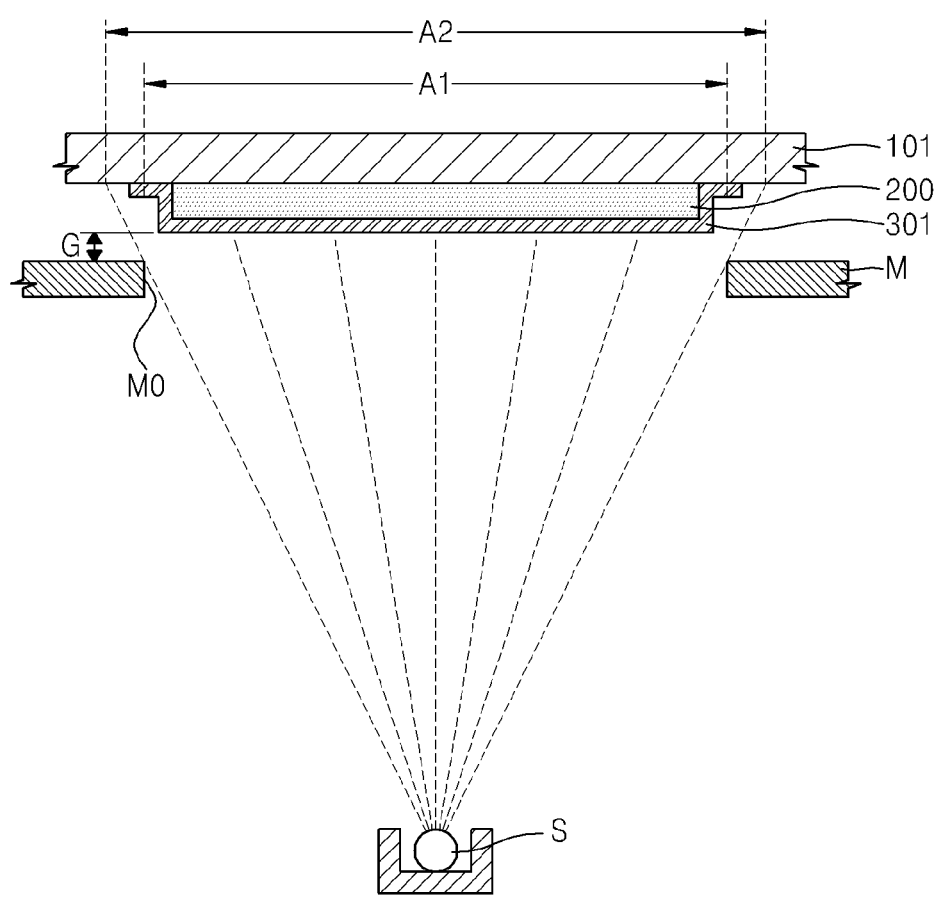
FIG. 4 is a diagram illustrating a method of manufacturing an organic light emitting display apparatus using an evaporation method, according to an embodiment of the present invention.
Figure 5:
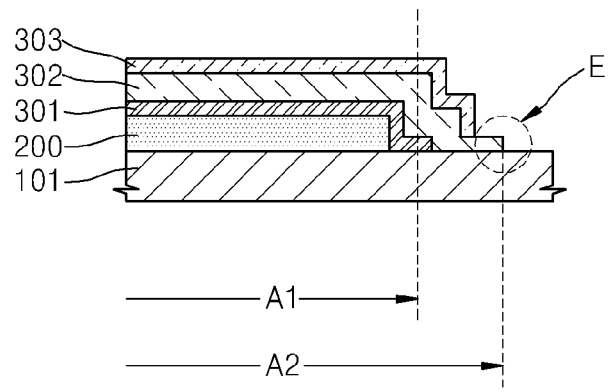
FIG. 5 is a cross-sectional view showing a part of an organic light emitting display apparatus manufactured by the method illustrated in FIG. 4.

FIG. 4 is a diagram schematically illustrating a method of manufacturing an organic light emitting display apparatus according to a deposition method, and FIG. 5 is a cross-sectional view showing a part of the organic light emitting display apparatus manufactured by the method illustrated in FIG. 4.

Referring to FIGS. 4 and 5, the first inorganic layer 301 is formed on the display unit 200. In FIGS. 4 and 5, the protective layer 220 (see FIG. 3) is omitted for convenience of description.

During deposition processes, if a mask M directly contacts the first inorganic layer 301, cracks may be generated in the first inorganic layer 301, and thus, the mask M and the first inorganic layer 301 are provided with a predetermined gap G therebetween.

When a source S is heated, an organic polymer of a vapor state evaporated from the source S is deposited on the first inorganic layer 301 on the substrate 101 via openings M0 formed in the mask M. Here, the organic polymer of the vapor state is infiltrated through the gap G, and is deposited on a region A2 that is out of an originally designed region A1 on the substrate 101.

In post processes, when the second inorganic layer 303 is formed by using a chemical vapor deposition (CVD), an end portion of the second inorganic layer 303 may not cover an end portion E of the first organic layer 302 formed on the region A2. Therefore, the first organic layer 302 may be exposed out of the second inorganic layer 303, and then, may be exposed to external oxygen and moisture.

However, the first organic layer 302 may be formed by using an inkjet printing method, not by using the evaporation method, according to the present embodiment.

Figure 6:
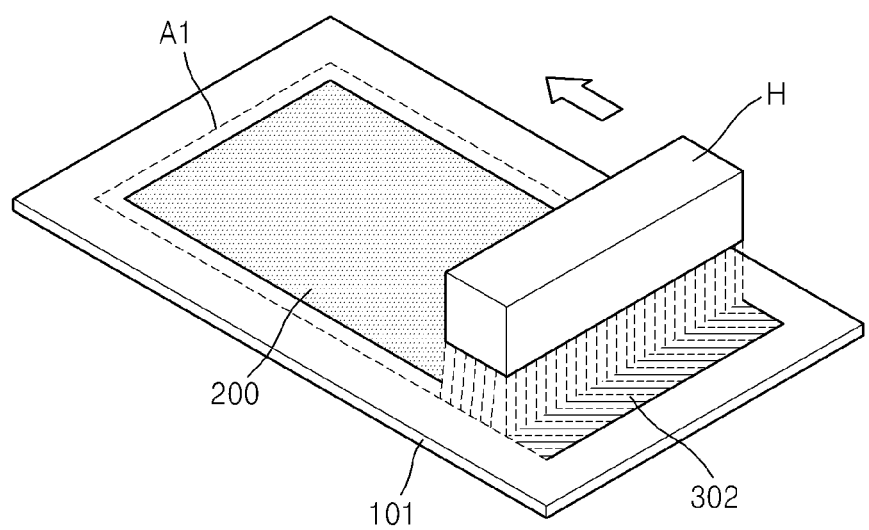
FIG. 6 is a schematic diagram illustrating a method of manufacturing an organic light emitting display apparatus according to an embodiment of the present invention.

FIG. 6 is a schematic diagram illustrating a method of manufacturing an organic light emitting display apparatus according to an embodiment of the present invention.

Referring to FIG. 6, the display unit 200 including a plurality of OLEDs (not shown) is formed on the substrate 101. For the convenience of description, the protective layer 220 (see FIG. 3) and the first inorganic layer 301 (see FIG. 3) are not shown.

In some embodiments, the first organic layer 302 is formed by using the inkjet printing method. Although not shown in FIG. 6, a plurality of inkjet nozzles may be included in a head H. In some embodiments, the head H forms the first organic layer 302 by discharging the organic polymer while scanning an upper portion of the display unit 200.

Since the first organic layer 302 is formed directly on the display unit 200 by using the inkjet printing method, not an evaporation method, dispersion of the first organic layer 302 to a region A2 that is out of a designed region A1 may be prevented as much as possible. Therefore, infiltration of the external oxygen and moisture into the OLED through the first organic layer 302 that is not covered by the inorganic layer may be prevented. Therefore, defects such as dark spots of the OLED may be prevented.

In embodiments where the first organic layer 302 includes a fluorescent light emission material, it may be detected in advance whether the first organic layer 302 is irregularly dispersed by checking boundary lines of the first organic layer 302 via an ultraviolet (UV) microscope.

In some OLEDs an out-gassing phenomenon of a first organic layer (similar to the first organic layer 302) may occur. The gas discharged from the first organic layer (similar to the first organic layer 302) may penetrate toward the OLED. Here, if there is a crack in a first inorganic layer (similar to the first inorganic layer 301), the gas infiltrates into the crack, thereby oxidating an opposite electrode (similar to the opposite electrode 215). Then, a dark spot may be generated.

In contrast, in the present embodiments the shielding layer 224 and the first inorganic layer 301 are porous and the cracks are not concentrated on a certain region, but dispersed throughout the entire shielding layer 224 and the first inorganic layer 301. Thus, the oxidation of the opposite electrode 215 is prevented, and generation of dark spots may be reduced.

In some embodiments, the second inorganic layer 303 may be formed on the first organic layer 302. In some embodiments, the second inorganic layer 303 may be formed to surround the first inorganic layer 301 and the first organic layer 302. That is, the entire portion of the first organic layer 302 is surrounded by the first inorganic layer 301 and the second inorganic layer 303, the infiltration of the external oxygen and the moisture may be effectively prevented.

In some embodiments, the second inorganic layer 303 may be formed of, for example, SiNx or SiOx, and may be formed to a predetermined thickness by using a chemical vapor deposition (CVD) method. In some embodiments, since the second inorganic layer 303 is formed by using the CVD method that does not use the plasma, the first organic layer 302 may not be damaged when forming the second inorganic layer 303. Accordingly, the out-gassing of the first organic layer 302 may be prevented.

In addition, the second inorganic layer 303 may be greater than the first inorganic layer 301, and may directly contact the interlayer insulation layer 205 on an outside of the display area. In some embodiments, the second inorganic layer 303 may be formed of the same material as that of the interlayer insulation layer 205. Accordingly, a bonding power between the second inorganic layer 303 and the interlayer insulation layer 205 may be improved.

In some embodiments, the second organic layer 304 and the third inorganic layer 305 may be further formed on the second inorganic layer 303, and the second organic layer 304 may be formed of the organic polymer that is the same as the material forming the first organic layer 302. In some embodiments, the second organic layer 304 may relieve stress applied to the first inorganic layer 301, and may cover particles even if they exist.

In some embodiments, the third inorganic layer 305 covers the second organic layer 304. In some embodiments, the third inorganic layer 305 may be formed of the same material as that of the second inorganic layer 303. In some embodiments, the third inorganic layer 305 is larger than the second inorganic layer 303, and may directly contact the interlayer insulation layer 205 on the outside of the display area. In some embodiments, the third inorganic layer 305 may be formed of the same material as that of the interlayer insulation layer 205. Accordingly, a bonding power between the third inorganic layer 305 and the interlayer insulation layer 205 may be improved.

In some embodiments, the encapsulation layer 300 may further include a plurality of inorganic layers and organic layers that are alternately disposed, and the number of stacking the inorganic layer and the organic layer is not limited.

In some embodiments, a protective film (not shown) may be attached to an upper surface of the encapsulation layer 300. If an attaching power of the protective film (not shown) is too strong, the encapsulation layer 300 may be isolated when removing the protective film (not shown). Thus, a fourth inorganic layer (not shown) that is formed of aluminum oxide having a weak attaching force against the protective film (not shown) may be further formed to address the above problem.

As described above, according to the one or more of the above embodiments of the present disclosure, the first organic layer 302 may be directly formed on the display unit 200 by using the inkjet printing method, not the evaporation method, and thus, the dispersion of the first organic layer 302 to the region A2 that is out of the originally designed region A1 may be prevented, and thereby improving the dark spot defects.

In some embodiments, the first organic layer 302 has the fluorescent light emission material, and thus, it may be detected in advance whether the first organic layer 302 is irregularly dispersed by checking boundary lines of the first organic layer 302 via a UV microscope.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present embodiments as defined by the following claims.

What is claimed is:

1. A composition comprising a compound of Formula 1, a compound of Formula 2, and a compound of Formula 3:

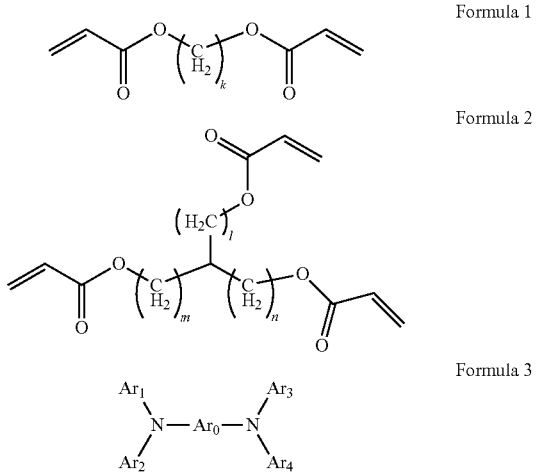

where k, l, m, and n respectively denote a number of 1 to 1,000,000, $Ar_0$ denotes a substituted or unsubstituted naphthylene group, a substituted or unsubstituted anthracenylene group, a substituted or unsubstituted phenanthrenyl group, a substituted or unsubstituted chrysenylene group, a substituted or unsubstituted pyrenylene group, a substituted or unsubstituted benzoanthracenylene group, a substituted or unsubstituted fluoranthenylene group, benzofluoranthenylene group, a substituted or unsubstituted perylenylene group, a substituted or unsubstituted coronenylene group, a substituted or unsubstituted pycenylene group, a substituted or unsubstituted diphenylanthracenyelen group, a substituted or unsubstituted triphenylene group, a substituted or unsubstituted rubicenylene group, a substituted or unsubstituted phenyl anthracenylene group, a substituted or unsubstituted bisanthracenylene group, a substituted or unsubstituted dianthracenylbenzynylene group, or a substituted or unsubstituted dibenzoanthracenylene group, and $Ar_1$ through $Ar_4$ respectively denote a C6 through C50 substituted or unsubstituted aryl group, a C1 through C50 substituted or unsubstituted alkyl group, a C3 through C50 substituted or unsubstituted cyclo alkyl group, a C7 through C50 substituted or unsubstituted aralkyl group, or a substituted or unsubstituted heteroaryl group having 5 to 50 ring atoms.

2. The composition of claim 1, wherein the compound of Formula 3 is a fluorescent light emission material.

3. The composition of claim 1, wherein k, l, m, and n independently denote a number of 1 to 10,000, respectively.

4. The composition of claim 1, wherein $Ar_0$ is an anthraceylene group, a pyrenylene group, or a chrysenylene group, and $Ar_1$ through $Ar_4$ respectively denote a C6 through C50 substituted or unsubstituted aryl group or a substituted or unsubstituted heteroaryl group having 5 to 50 ring atoms.

5. The composition of claim 1, wherein a sum of a weight of the compound of Formula 1 and a weight of the compound of Formula 2 is about 95 to about 99.9 weight % of a total weight of the composition, and the weight of the compound of Formula 3 may be about 0.1 to about 5 weight % of the total weight of the composition.

6. An organic light emitting display apparatus comprising:
a substrate;
a display unit including a plurality of organic light emitting devices (OLEDs) arranged on the substrate; and
an encapsulation layer for sealing the display unit,
wherein the encapsulation layer comprises at least one organic layer and at least one inorganic layer stacked with each other, and the organic layer comprises the composition of claim 1.

7. The organic light emitting display apparatus of claim 6, wherein the compound of Formula 3 is a fluorescent light emission material.

8. The organic light emitting display apparatus of claim 6, wherein k, l, m, and n independently denote a number of 1 to 10,000, respectively.

9. The organic light emitting display apparatus of claim 6, wherein $Ar_0$ is an anthraceylene group, a pyrenylene group, or a chrysenylene group, and $Ar_1$ through $Ar_4$ respectively denote a C6 through C50 substituted or unsubstituted aryl group or a substituted or unsubstituted heteroaryl group having 5 to 50 ring atoms.

10. The organic light emitting display apparatus of claim 6, wherein a sum of a weight of the compound of Formula 1 and a weight of the compound of Formula 2 is about 95 to about 99.9 weight % of a total weight of the composition, and the weight of the compound of Formula 3 may be about 0.1 to about 5 weight % of the total weight of the composition.

11. The organic light emitting display apparatus of claim 6, wherein the at least one inorganic layer is larger than the at least one organic layer so as to cover end portions of the at least one organic layer.

12. The organic light emitting display apparatus of claim 6, wherein the OLED comprises a pixel electrode, an intermediate layer disposed on the pixel electrode and including an organic emission layer, and an opposite electrode disposed on the intermediate layer, and a capping layer covering the opposite electrode is further formed between the opposite electrode and the encapsulation layer.

13. The organic light emitting display apparatus of claim 12, wherein the capping layer comprises an organic material.

14. The organic light emitting display apparatus of claim 12, further comprising a shielding layer including lithium fluoride (LiF) between the capping layer and the encapsulation layer.

15. The organic light emitting display apparatus of claim 6, wherein one of the at least one inorganic layer is a porous inorganic layer.

16. The organic light emitting display apparatus of claim 6, wherein the porous inorganic layer includes aluminum oxide.

17. A method of manufacturing an organic light emitting display apparatus, the method comprising:
forming a plurality of organic light emitting devices (OLEDs) on a substrate; and
forming an encapsulation layer covering the OLEDs,
wherein the encapsulation layer is formed to include at least one organic layer including the composition of claim 1, and at least one inorganic layer, and the at least one organic layer is formed by using an inkjet printing method.

18. The method of claim 17, wherein one of the at least one inorganic layer is formed by using a sputtering method.

19. The method of claim 17, wherein one of the at least one inorganic layer is formed by using a chemical vapor deposition method.

20. The method of claim 17, wherein the at least one of inorganic layer is greater than the at least one organic layer so as to cover end portions of the organic layer.

\* \* \* \* \*